United States Patent [19]
Kim et al.

[11] Patent Number: 5,932,920
[45] Date of Patent: Aug. 3, 1999

[54] NONVOLATILE MEMORY DEVICE AND MANUFACTURING METHOD THEREOF

[75] Inventors: Dong-jun Kim, Kyungki-do; Jeong-hyuk Choi, Seoul; Jeong-hyong Yi, Kyungki-do, all of Rep. of Korea

[73] Assignee: Samsung Electronics Co., Ltd.

[21] Appl. No.: 08/633,642

[22] Filed: Apr. 17, 1996

[30] Foreign Application Priority Data

Apr. 17, 1995 [KR] Rep. of Korea .................. 95-9000

[51] Int. Cl.⁶ ............... H01L 29/76; H01L 29/94; H01L 31/062; H01L 31/113
[52] U.S. Cl. .................. 257/395; 257/412; 257/396
[58] Field of Search .................. 257/394, 395, 257/333, 316, 337, 296, 412; 438/926

[56] References Cited

U.S. PATENT DOCUMENTS

| | | | |
|---|---|---|---|
| 4,326,331 | 4/1982 | Guterman | 257/316 |
| 4,910,566 | 3/1990 | Ema | 257/316 |
| 5,026,657 | 6/1991 | Lee et al. | 257/296 |
| 5,247,197 | 9/1993 | Ema | 257/296 |
| 5,698,902 | 12/1997 | Uehara et al. | 157/773 |

FOREIGN PATENT DOCUMENTS

| | | | |
|---|---|---|---|
| 0042643 | 12/1981 | European Pat. Off. | 257/395 |
| 53-108391 | 9/1978 | Japan | 257/394 |
| 60-66444 | 4/1985 | Japan | 257/394 |
| 2-56963 | 2/1990 | Japan | 257/395 |

*Primary Examiner*—Olik Chaudhuri
*Assistant Examiner*—Phat X. Cao
*Attorney, Agent, or Firm*—Pillsbury Madison & Sutro LLP

[57] ABSTRACT

A nonvolatile memory device and a manufacturing method thereof are provided. The nonvolatile memory device includes memory cells which are formed in a cell array region, peripheral circuit devices which are formed in a peripheral circuit region at the periphery of the cell array region, a field oxide film which is formed between the cell array region and the peripheral circuit region, and a dummy conductive pattern which is formed along and on the field oxide film. Accordingly, damage to the substrate formed between the peripheral circuit region and the cell array region can be reduced, thus a characteristic of insulation between devices can be enhanced.

3 Claims, 7 Drawing Sheets

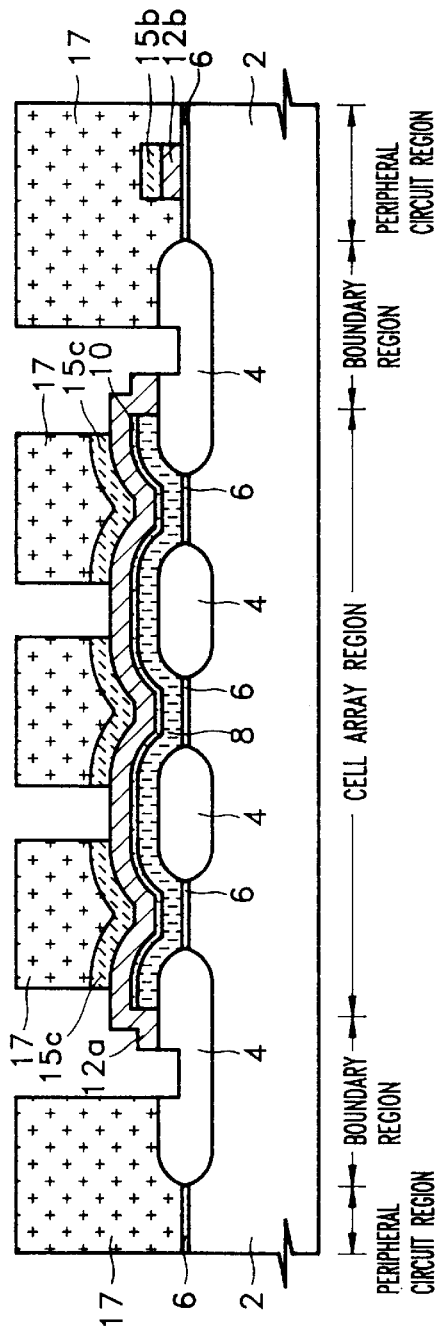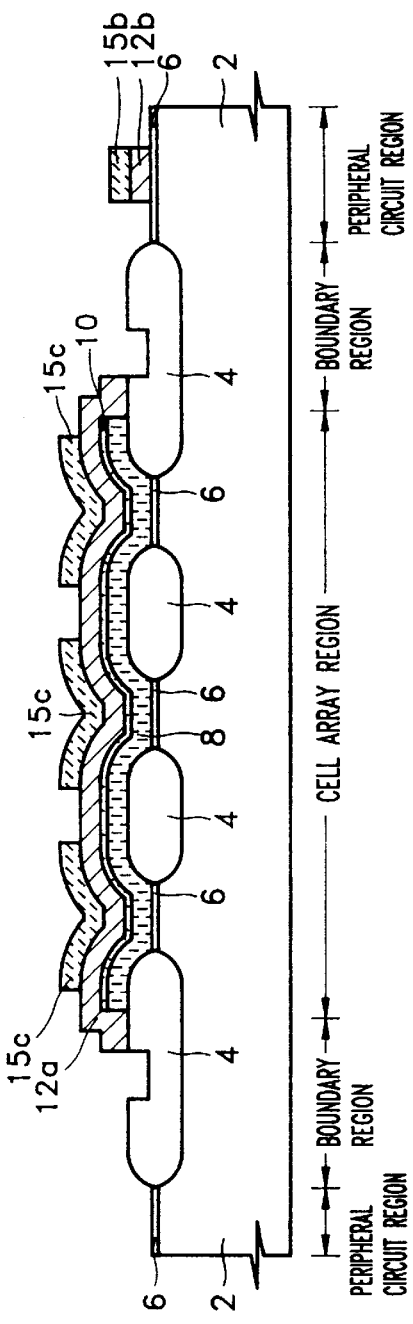
FIG. 2B (PRIOR ART)
FIG. 2C (PRIOR ART)

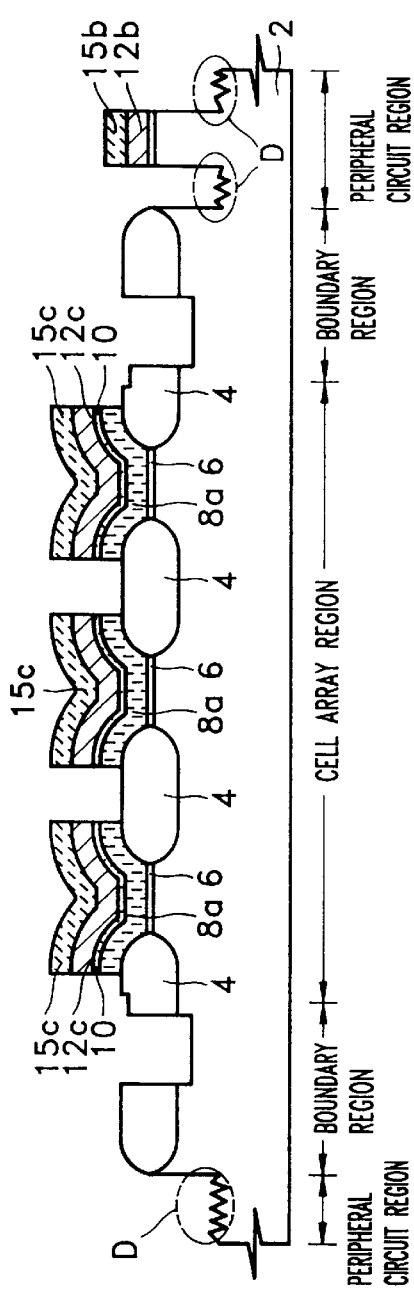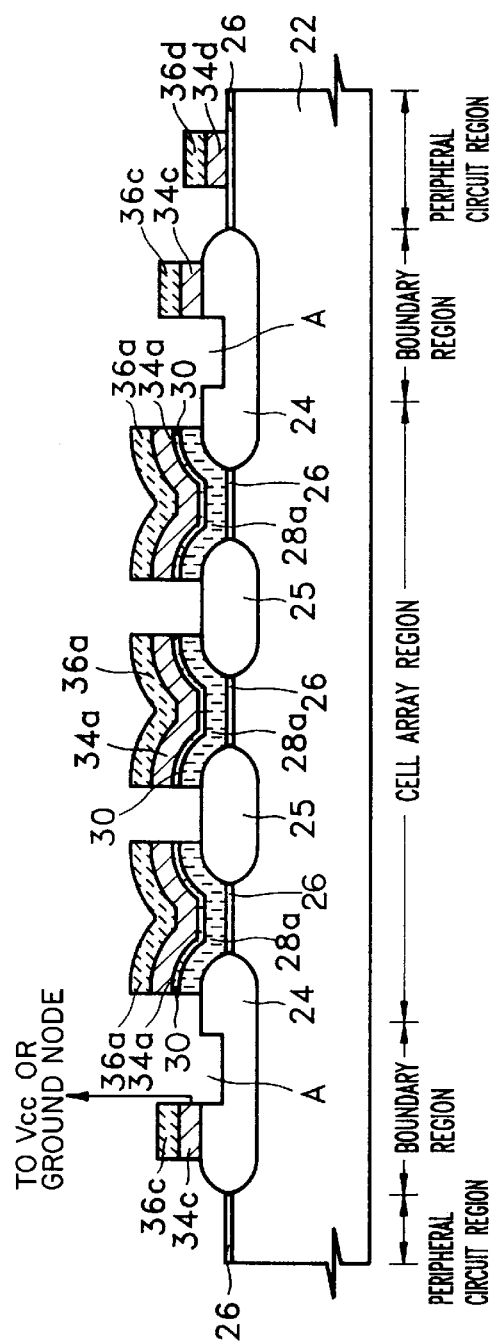
FIG.2D (PRIOR ART)
FIG. 3

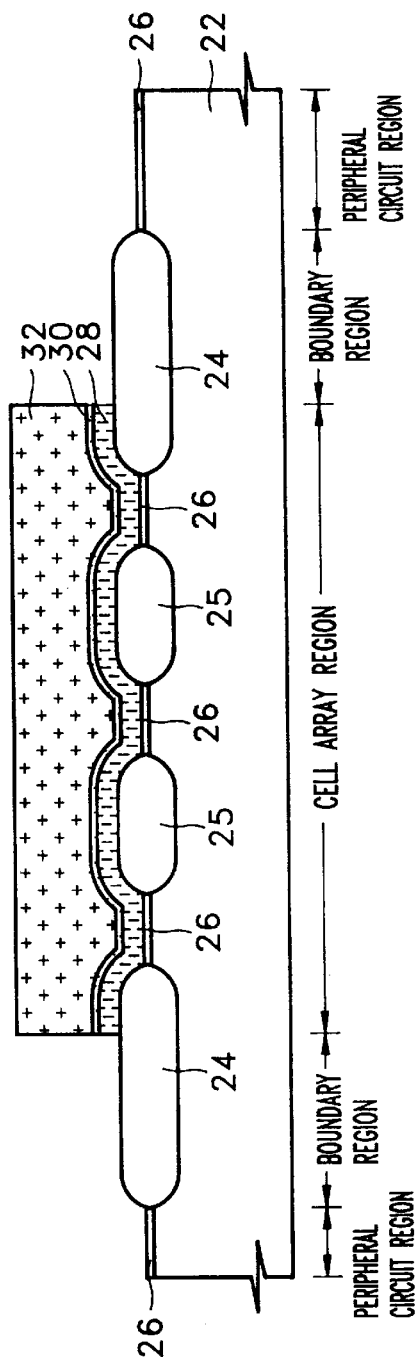
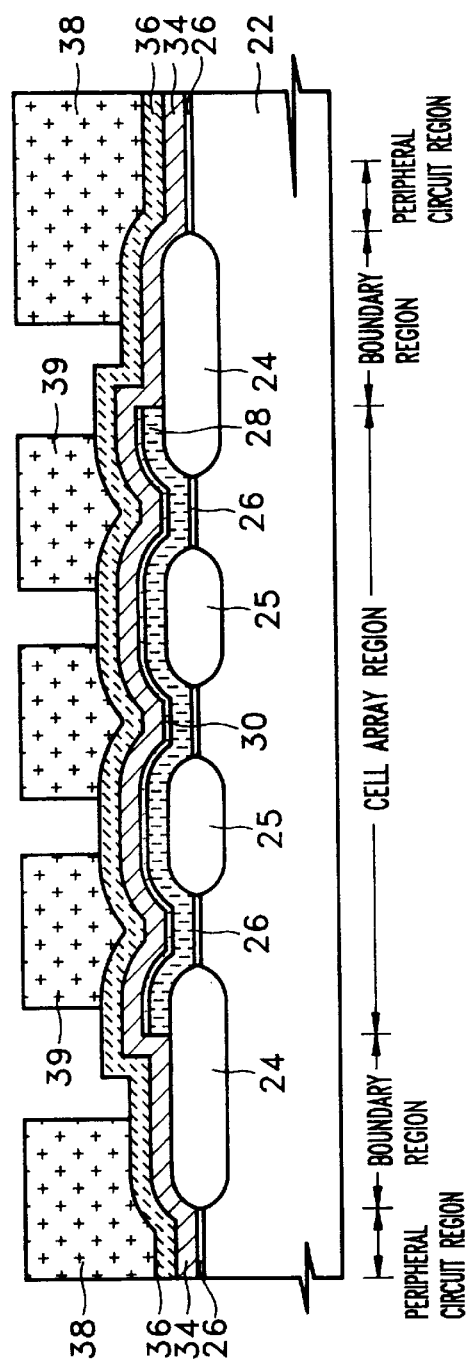

NONVOLATILE MEMORY DEVICE AND MANUFACTURING METHOD THEREOF

BACKGROUND OF THE INVENTION

The present invention relates to a semiconductor memory device and a manufacturing method thereof, and more particularly, to a nonvolatile memory device in which a dummy conductive pattern is formed on a field oxide film between a cell array region and a peripheral circuit region and to a manufacturing method thereof.

A flash EEPROM has a floating gate for storing data and a control gate for controlling the floating gate, and is characterized by data being programmed or erased by application of a high voltage signal to the control gate or a pocket well.

The technique of the flash EEPROM is disclosed in detail in "A 2.3 $\mu m^2$ Memory Cell Structure for 16 Mb NAND EEPROMs" of pp. 103–106 of IEDM written by R. Shirota et al in 1990.

In manufacturing the flash EEPROM, a self alignment process in which accumulated multilayer materials are simultaneously etched is necessary for forming the control gate and the floating gate.

FIGS. 1A through 1C are sectional views for illustrating a conventional manufacturing method of a nonvolatile memory device, particularly, the above-mentioned self alignment process.

First, field oxide film 4 is formed on a surface of semiconductor substrate 2, and thin oxide film 6 is formed on an active region of the semiconductor substrate, and then floating gate formation material 8 and insulating film 10 are accumulated. Subsequently, floating gate formation material 8 and insulating film 10 are etched using a mask pattern (not shown) for forming a floating gate, and then control gate formation material 12 is deposited on the whole surface of the resultant substrate. Next, first photosensitive film pattern 16 covering a cell array region and gate electrodes of a peripheral circuit region is formed (see FIG. 1A).

Through an etching process, using the first photosensitive film pattern 16, control gate pattern 12a is formed in the cell array region, and gate electrode 12b is formed in the peripheral circuit region. Then, second photosensitive film pattern 17, for covering the peripheral circuit region and the region where a control gate of the cell array region will be formed, is formed (see FIG. 1B).

By simultaneously etching of the accumulated materials, using the second photosensitive film patterns for forming the control gate as a mask (the process of self alignment), cells having floating gate 8a, insulating film 10 and control gate 12c are formed in the cell array region (see FIG. 1C).

While the distance between cells becomes narrower, as integration of the memory device is increased, the thickness of accumulated layers on the semiconductor substrate such as the floating gate formation material, the insulating film, the control gate formation material and the second photosensitive film pattern remains unchanged. Accordingly, the aspect ratio(height/width) between the patterns becomes higher during the process of self alignment (the processes of FIGS. 1B and 1C).

The distance between the cells (reference character "A" of FIG. 1B) is reduced to about 0.5 $\mu m$ as integration is increased, while the height of a cell pattern including the floating gate, the control gate and the second photosensitive film pattern is approximately 1.5 $\mu m$. Accordingly, a very high aspect ratio of approximately 3.0 results during the process of self alignment. The usual thickness of the floating gate is 1,000 Å–2,000 Å, that of the control gate is approximately 3,000 Å, and that of the second photosensitive film pattern is approximately 10,000 Å.

In the case of a high aspect ratio between patterns, etchant flows between the patterns so unstably that the patterns form non-uniformly.

FIGS. 2A through 2D are sectional views for illustrating another conventional manufacturing method of a nonvolatile memory device, which is proposed for solving the problems described above and illustrated in FIGS. 1A through 1C.

An insulating material layer is coated on the control gate formation material, and then first photosensitive film pattern 16 is formed the such manner as that described above with respect to FIG. 1A. Subsequently, the accumulated materials on the semiconductor substrate are etched using first photosensitive film pattern 16 to form gate electrode 12b in the peripheral circuit region 16, and pattern 12a for forming a control gate in the cell array region (see FIG. 2A). Here, insulating material patterns 15a and 15b are formed on pattern 12a for forming the control gate and gate electrode 12b, respectively.

Subsequently, second photosensitive film pattern 17 is formed on the resultant substrate having insulating material patterns 15a and 15b, and then control gate pattern 15c is formed by anisotropically etching insulating material patterns 15a and 15b using second photosensitive film pattern 17 as a mask (see FIG. 2B). The second photosensitive film pattern 17 is then eliminated (see FIG. 2C).

Through an anisotropic etching process using control gate pattern 15c as a mask, cells having floating gate 8a, insulating film 10 and control gate 12c are formed in the cell array region (see FIG. 2D).

In the manufacturing method as described in FIGS. 2A through 2D, the process of self alignment is performed using insulating material patterns 15a and 15b as a mask, so that the aspect ratio between patterns can be lowered by the height of the second photosensitive film pattern. Accordingly, non-uniformity of patterns due to non-uniform flow of etchant running between patterns can be reduced.

However, damages "D" to substrates occur in the peripheral circuit region and the boundary region, as shown in FIG. 2D, causing deterioration in the reliability of the memory device.

SUMMARY OF THE INVENTION

Accordingly, it is an object of the present invention to provide a nonvolatile memory device for enhancing insulation between devices by reducing damage in a substrate in a peripheral circuit region and a boundary region.

It is another object of the present invention to provide a manufacturing method of the nonvolatile memory device.

To accomplish the above described first object of the present invention, there is provided a nonvolatile memory device including memory cells which are formed in a cell array region, peripheral circuit devices which are formed in a peripheral circuit region at the periphery of the cell array region, a field oxide film which is formed between the cell array region and the peripheral circuit region, and a dummy conductive pattern which is formed along and on the field oxide film.

It is preferable that a groove is further formed in the field oxide film in parallel alignment with one side of the dummy conductive pattern.

It is preferable that the dummy conductive pattern is electrically connected to either a ground node on a power supply electrode, and that it is formed of the same material as that of the control gate in the memory cell. It is further preferable that the material is selected from a group consisting of polysilicon and polycide, which is made of accumulated polysilicon and silicide.

To accomplish the above described second object of the present invention, there is provided a manufacturing method of the nonvolatile memory device comprising the steps of: forming a first field oxide film for defining a cell array region and a peripheral circuit region, and a second field oxide film defining a unit memory cell region in the cell array region on the semiconductor substrate; forming a first insulating film on an exposed semiconductor substrate between the first and second field oxide films, forming a first conductive layer and a second insulating film sequentially on the resultant substrate having the first insulating film; forming a first photosensitive film pattern for forming a floating gate on the resultant substrate having the first conductive layer and second insulating film; etching accumulated materials on the first insulating film by using the first photosensitive film pattern; eliminating the first photosensitive film pattern; forming a second conductive layer and an etching stopper layer sequentially on the obtained resultant substrate; forming a second photosensitive film pattern covering a part of the first field oxide film and the peripheral circuit region, and forming a third photosensitive film pattern for forming a control gate, on the etching stopper layer; patterning the etching stopper layer using the second and third photosensitive film patterns; eliminating the second and third photosensitive film patterns; patterning accumulated materials on the semiconductor substrate using the patterned etching stopper layer; forming a fourth photosensitive film pattern to cover the cell array region and a part of the first field oxide film which has been covered by the second photosensitive film pattern, and forming a fifth photosensitive film pattern for forming a device which forms the peripheral circuit region, on the obtained resultant substrate; and forming a peripheral circuit device in the peripheral circuit region and a dummy conductive pattern on the first field oxide film by patterning accumulated materials on the semiconductor substrate using the fourth and fifth photosensitive film patterns.

It is preferable that the first insulating film is formed by growing an oxide to a thickness of approximately 100 Å. It is also preferable that the first conductive layer is formed by depositing polysilicon to a thickness of 1,000 Å–2,000 Å, and the second conductive layer is formed by depositing polysilicon or polycide which is made of accumulated polysilicon and silicide, to a thickness of 2,000 Å–3,000 Å. It is further preferable that the second insulating film is formed in an accumulated form of an oxide film/ a nitride film/ an oxide film.

It is preferable that the etching stopper layer be a material having high etching selectivity to material forming the first and second conductive layers, and further that it be an oxide film or a nitride film formed by a chemical vapor deposition method.

In the nonvolatile memory device and the manufacturing method thereof according to the present invention, the insulation property between devices can be enhanced.

BRIEF DESCRIPTION OF THE DRAWINGS

The above objects and advantages of the present invention will become more apparent by describing in detail a preferred embodiment thereof with reference to the attached drawings in which:

FIGS. 2A through 2D are sectional views for illustrating another conventional manufacturing method of a nonvolatile memory device;

FIG. 3 is a sectional view of a nonvolatile memory device according to the present invention; and FIGS. 4A through 4F are sectional views for illustrating a manufacturing method of a nonvolatile memory device according to the present invention.

DETAILED DESCRIPTION OF THE INVENTION

Figure 1A:
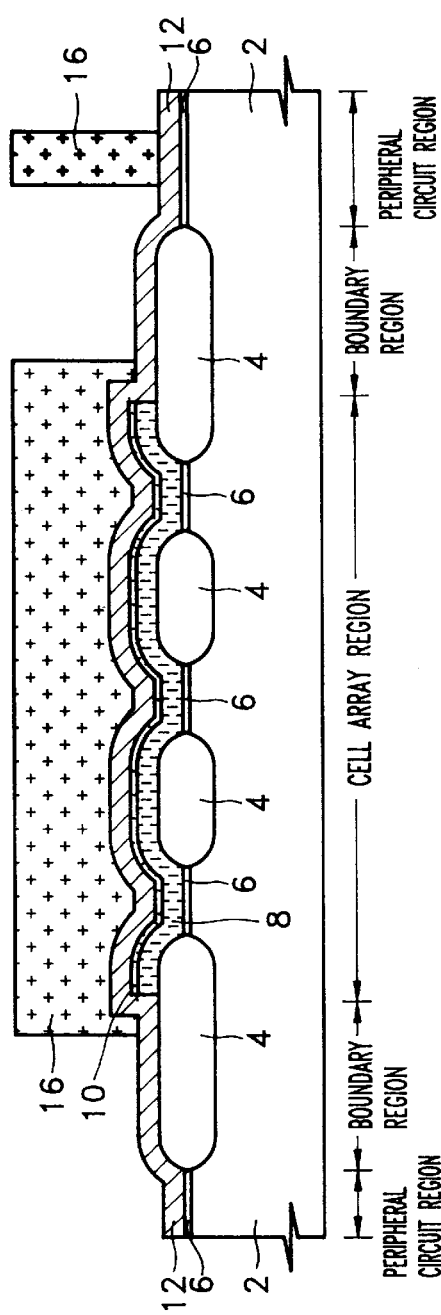
FIGS. 1A through 1C are sectional views for illustrating a conventional manufacturing method of a nonvolatile memory device.
Figure 1B:
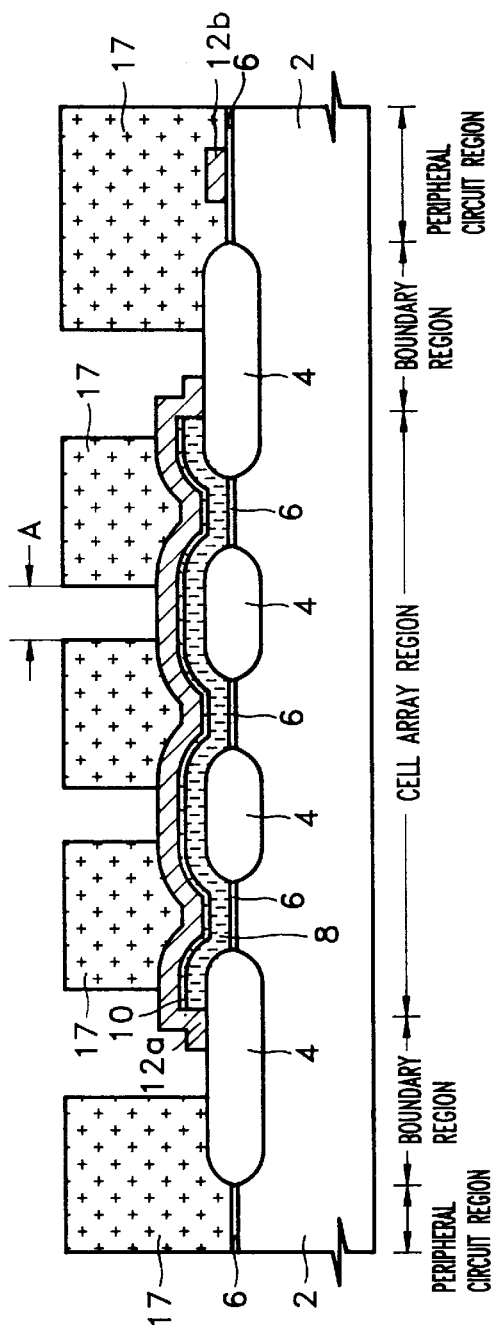
Figure 1C:
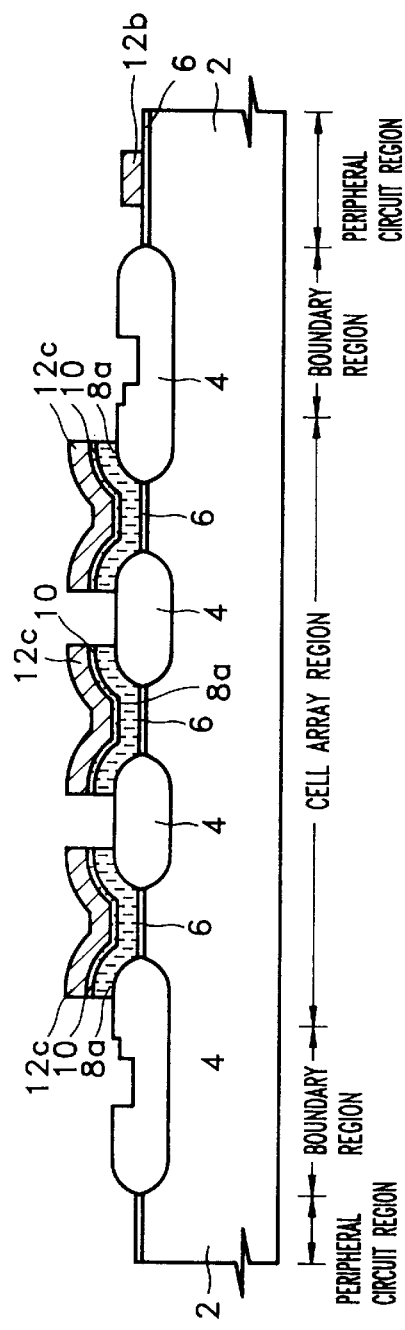
Figure 2A:
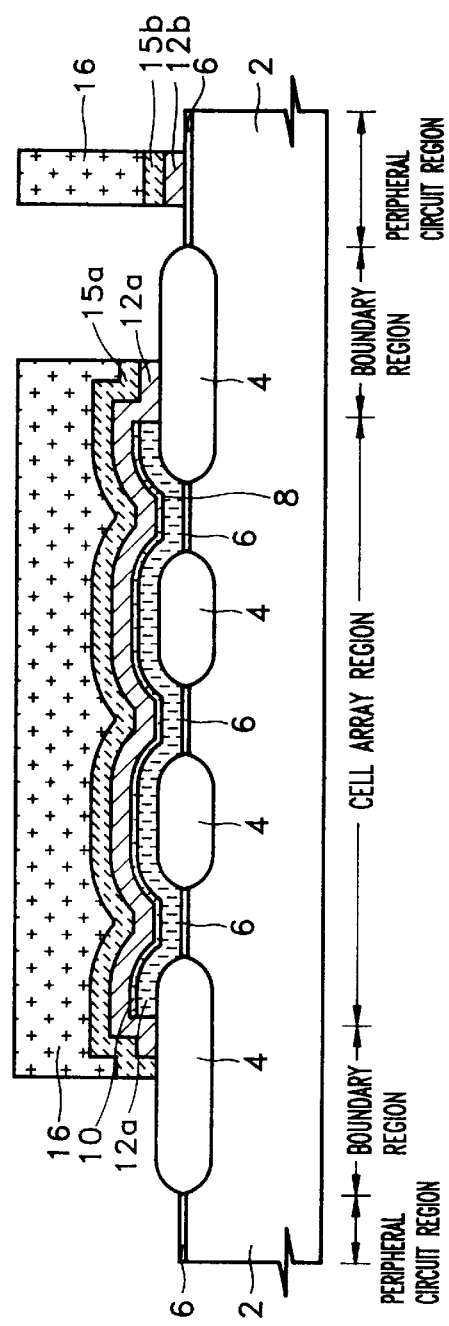

In FIG. 3, reference numeral 22 indicates a semiconductor substrate, 24 indicates a first field oxide film, 25 indicates a second field oxide film, 26 indicates a first insulating film, 28a indicates a floating gate, 30 indicates a second insulating film, 34a indicates a control gate, 34c indicates a dummy conductive pattern, 34d indicates a peripheral circuit device, 36a indicates a first etching stopper layer pattern, 36c indicates a third etching stopper layer pattern and 36d indicates a fourth etching stopper layer pattern.

First field oxide film 24 for defining a cell array region and a peripheral circuit region and second field oxide film 25 for defining each cell unit in the cell array region are formed on semiconductor substrate 22, and first insulating film 26 is formed on semiconductor substrate 22 between field oxide films 24 and 25. The cell array region has cells, formed of first insulating film 26, floating gate 28a, second insulating film 30 and control gate 34a, and first etching stopper layer pattern 36a is formed on control gate 34a of each cell. Dummy conductive pattern 34c is formed on first field oxide film 24. Groove "A" is formed in first field oxide film 24 in alignment with one side of the dummy conductive pattern 34c, and third etching stopper layer pattern 36c is formed on dummy conductive pattern 34c. The peripheral circuit region has peripheral circuit device 34d and fourth etching stopper layer pattern 36d accumulated thereon.

Here, dummy conductive pattern 34c is connected to a ground node or power supply electrode Vcc (not shown).

FIG. 4A illustrate the process of forming a first photosensitive film pattern 32 for forming a floating gate to be comprised of multiple steps or processes.

The first step involves forming first field oxide film 24 for defining a cell array region and a peripheral circuit region and second field oxide film 25 for defining each cell unit in the cell array region by a usual local oxidation of silicon (LOCOS) method on semiconductor substrate 22.

The second step involves forming first insulating film 26 on exposed semiconductor substrate 22, between first and second field oxide films 24 and 25 by growing an oxide film.

The third step involves forming first conductive layer 28 by depositing conductive material such as polysilicon on the resultant substrate, having first insulating film 26, to a thickness of 1,000 Å–2,000 Å.

The fourth step involves forming second insulating film 30 which is accumulated in the form of an oxide film/a nitride film/an oxide film on first conductive layer 28.

The fifth step involves forming first photosensitive film pattern 32 for forming the floating gate by coating the formed second insulating film with photosensitive material such as photoresist and then developing the coated photosensitive material.

Finally the sixth step involves anisotropically etching the accumulated materials on the semiconductor substrate using first photosensitive film pattern 32 as a mask.

Here, it is also possible to perform the fourth step of forming second insulating film 30 after the sixth step of etching the accumulated materials on semiconductor substrate 22. That is, the process of forming second insulating film 30 can be performed in various manners.

FIG. 4B illustrates the formation of second conductive layer 34, etching stopper layer 36, second photosensitive film pattern 38 and third photosensitive film pattern 39 to be comprised of multiple steps or processes The first step involves eliminating first photosensitive film pattern 32(shown in FIG. 4A) and then accumulating second conductive layer 34 and etching stopper layer 36 on the whole surface of the structure resultant from the removal of the first photosensitive film.

The second step of involves coating etching stopper layer 36 with photosensitive material such as photoresist to a thickness of, for example, 1.0 μm.

Finally the third step involves forming second photosensitive film pattern 38, which covers the peripheral circuit region and extends over a part of first field oxide film 24, and third photosensitive film pattern 39 for forming a control gate.

Here, second conductive layer 34 is formed by depositing polysilicon or polycide, which is made of accumulated polysilicon and silicide, to a thickness of 2,000–3,000 Å, and etching stopper layer 36 is formed by depositing material having high etching selectivity to material forming the first and second conductive layers, e.g., an oxide layer or a nitride layer by a chemical vapor deposition method.

Figure 4C:
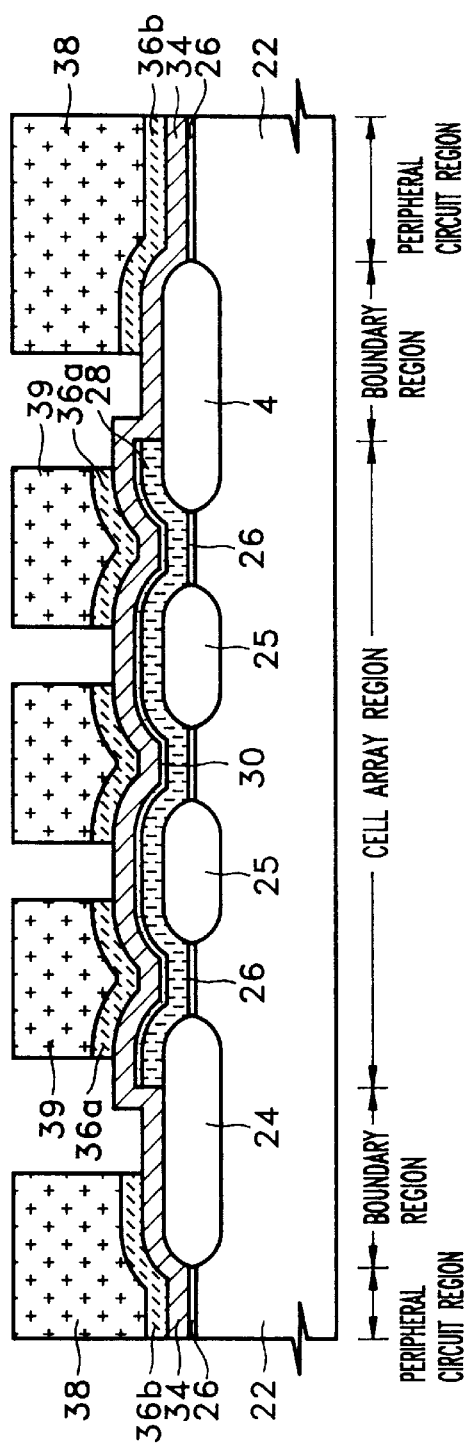

As shown in FIG. 4C, the etching, stopper layer 36 (shown in FIG. 4B) is anisotropically etched using second and third photosensitive film patterns 38 and 39 as a mask, to form first etching stopper layer pattern 36a and second etching stopper layer pattern 36b, respectively.

Figure 4D:
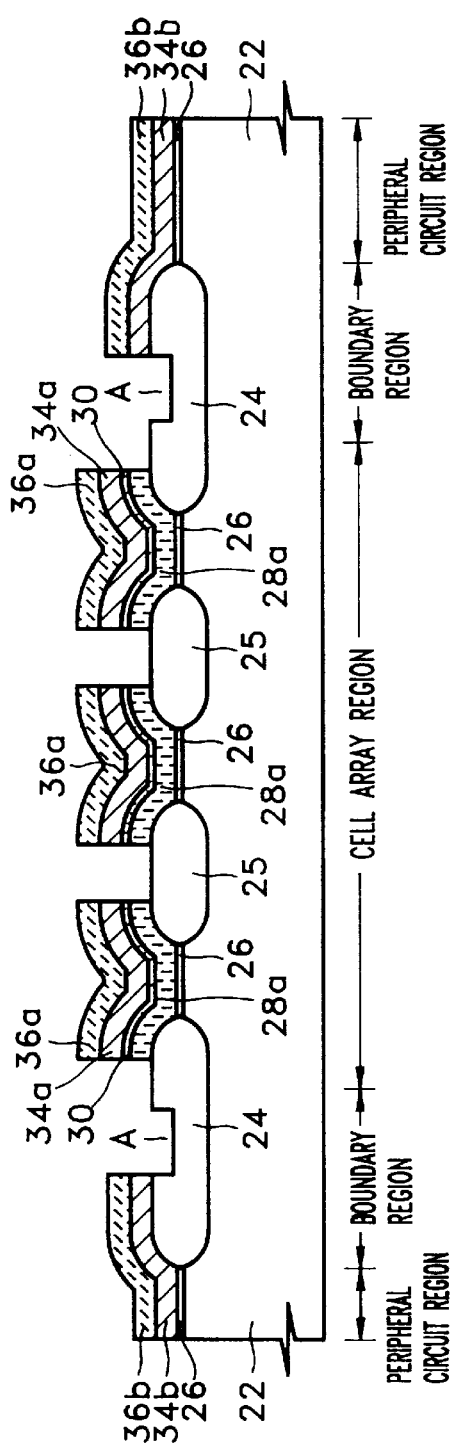

As shown in FIG. 4D, accumulated materials on semiconductor substrate 22 are anisotropically etched using first and second etching stopper layer patterns 36a and 36b as a mask, so that each cell comprised of first insulating film 26, floating gate 28a, second insulating film 30 and control gate 34a is formed in a cell array region. Conductive pattern 34b, which covers part of field oxide film 24 and the peripheral circuit region, is also formed in the peripheral circuit region.

Here, a thickness of the accumulated material layers in the cell array region is different from that of the accumulated material in the peripheral circuit region, so that groove "A" is formed in first oxide film 24 between second photosensitive film pattern 38 (of FIG. 4C) and third photosensitive film pattern 39 (of FIG. 4C).

Figure 4E:
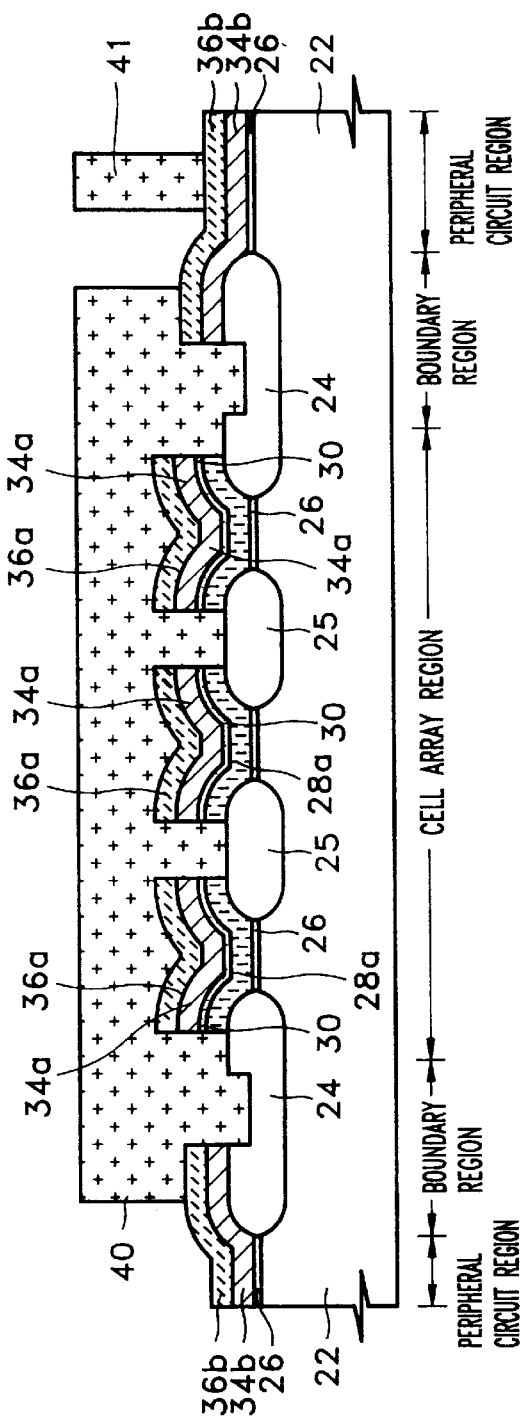

As shown in FIG. 4E, the whole surface of the resultant substrate where unit cells are formed in the cell array region is coated with photosensitive material such as photoresist, and then the photosensitive material is developed, to form fourth photosensitive film pattern 40 which covers a part of first field oxide film 24 and all of the cell array region. Fifth photosensitive film pattern 41 is used for forming a peripheral circuit device.

Here, a region protected by fourth photosensitive pattern 40 should be overlapped with a part of a region which has been protected by second photosensitive film pattern 38. That is, fourth photosensitive film pattern 40 is formed in order to protect a part of second etching stopper layer pattern 36b.

Figure 4F:
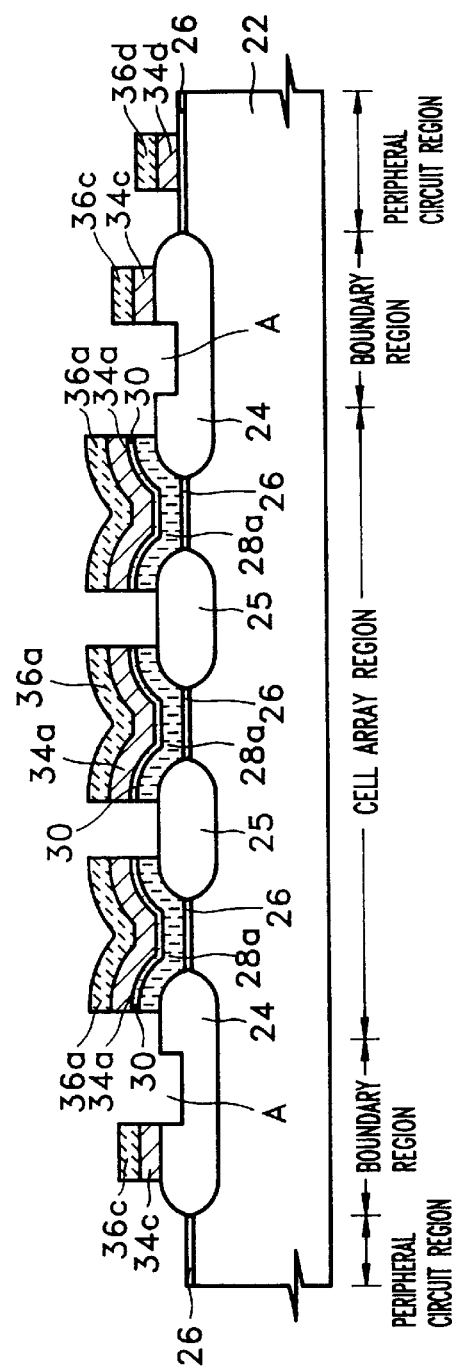

As shown in FIG. 4F, the accumulated materials on the semiconductor substrate are anisotropically etched using the fourth and fifth photosensitive film patterns 40 and 41 as a mask, to form dummy conductive pattern 34c and peripheral circuit device 34d identical to fifth photosensitive film pattern 41 (of FIG. 4E).

In the nonvolatile memory device and the manufacturing method thereof, according to the present invention, dummy conductive pattern 34c is formed on first field oxide film 24 between the peripheral circuit region and the cell array region, thereby reducing the possibility of damage of first field oxide film 24 and/or the substrate of the peripheral circuit region. Thus, the insulation characteristics are between devices enhanced.

It should be understood that the invention is not limited to the illustrated embodiment and that many changes and modifications can be made within the scope of the invention by a skilled person in the art.

What is claimed is:

1. A nonvolatile memory device comprising:

memory cells which are formed in a cell array region;

peripheral circuit devices which are formed in a peripheral circuit region at the periphery of said cell array region;

a field oxide film which is formed between said cell array region and said peripheral circuit region;

a dummy conductive pattern which is formed along and on said field oxide film and is formed of the same material as that forming a control gate in the memory cell and a gate in the peripheral circuit devices;

a groove formed in said field oxide film in parallel alignment with one side of said dummy conductive pattern; and an etching stopper layer pattern formed on said dummy conductive pattern.

2. A nonvolatile memory device according to claim 1, wherein said dummy conductive pattern is electrically connected to one of a ground node and power supply electrode.

3. A nonvolatile memory device according to claim 1, wherein said material is one selected from the group consisting of polysilicon and polycide, which is made of accumulated polysilicon and silicide.

* * * * *